(12) United States Patent
Chen

(10) Patent No.: US 11,094,748 B2
(45) Date of Patent: Aug. 17, 2021

(54) PIXEL ARRANGEMENT STRUCTURE

(71) Applicant: Wuhan China Star Optoelectronics Semiconductor Display Technology Co., Ltd., Wuhan (CN)

(72) Inventor: Jun Chen, Wuhan (CN)

(73) Assignee: WUHAN CHINA STAR OPTOELECTRONICS SEMICONDUCTOR DISPLAY TECHNOLOGY CO., LTD., Hubei (CN)

( * ) Notice: Subject to any disclaimer, the term of this patent is extended or adjusted under 35 U.S.C. 154(b) by 365 days.

(21) Appl. No.: 16/307,470

(22) PCT Filed: Sep. 26, 2018

(86) PCT No.: PCT/CN2018/107764
§ 371 (c)(1),
(2) Date: Dec. 5, 2018

(87) PCT Pub. No.: WO2020/000728
PCT Pub. Date: Jan. 2, 2020

(65) Prior Publication Data
US 2021/0098540 A1    Apr. 1, 2021

(30) Foreign Application Priority Data

Jun. 29, 2018 (CN) .......................... 201810712769.4

(51) Int. Cl.
*H01L 27/32* (2006.01)
(52) U.S. Cl.
CPC ............................ *H01L 27/3218* (2013.01)

(58) Field of Classification Search
CPC ..................... H01L 27/3218; H01L 27/3216; H01L 27/326
See application file for complete search history.

(56) References Cited

U.S. PATENT DOCUMENTS

| 2011/0012820 A1* | 1/2011 | Kim ..................... G09G 3/3208 345/82 |
| 2013/0234917 A1* | 9/2013 | Lee ..................... H01L 27/3218 345/82 |

(Continued)

FOREIGN PATENT DOCUMENTS

| CN | 104681594 A | 6/2015 |
| CN | 106981501 A | 7/2017 |

(Continued)

*Primary Examiner* — Matthew C Landau
*Assistant Examiner* — Eric K Ashbahian
(74) *Attorney, Agent, or Firm* — Leong C. Lei

(57) ABSTRACT

A pixel arrangement structure is disclosed. The structure includes multiple first pixel rows and multiple second pixel rows arranged alternately. Wherein each of the first pixel rows includes multiple first sub-pixels and multiple second sub-pixels disposed alternately and at intervals, and each of the second pixel rows includes multiple third sub-pixels disposed at intervals. Wherein the first sub-pixel and the second sub-pixel adjacent to the third sub-pixel form a virtual triangle, the third sub-pixel is disposed in the virtual triangle formed by the first sub-pixel and the second sub-pixel adjacent to the third sub-pixel. Applying the pixel arrangement structure to an OLED display panel can improve the resolution, reduce the fabrication difficulty, increase the pixel area, and improve the brightness and life of the OLED display panel.

7 Claims, 4 Drawing Sheets

(56) References Cited

U.S. PATENT DOCUMENTS

| | | | | |
|---|---|---|---|---|
| 2016/0064458 A1* | 3/2016 | Lee | ............... | H01L 27/326 |
| | | | | 345/694 |
| 2018/0175121 A1* | 6/2018 | Ji | ............... | H01L 51/52 |
| 2020/0058713 A1* | 2/2020 | Zhang | ............... | C23C 14/24 |
| 2020/0273924 A1* | 8/2020 | Xiao | ............... | C23C 14/04 |

FOREIGN PATENT DOCUMENTS

| | | |
|---|---|---|
| CN | 107706213 A | 2/2018 |
| CN | 107887404 A | 4/2018 |

* cited by examiner

1

PIXEL ARRANGEMENT STRUCTURE

FIELD OF THE INVENTION

The present invention relates to a display technology field, and more particularly to a pixel arrangement structure.

BACKGROUND OF THE INVENTION

Organic Light Emitting Display (OLED) has many advantages such as self-luminous, low driving voltage, high luminous efficiency, short response time, high definition and contrast ratio, near 180° viewing angle, wide temperature range, flexible display and large-area full-color display such that the OLED has been recognized by the industry as the most promising display device.

According to the driving method, OLED can be divided into two types: a passive matrix OLED (PMOLED) and an active matrix OLED (AMOLED), namely direct addressing and thin-film transistor (TFT) matrix addressing. Wherein the AMOLED has pixels arranged in an array, and belongs to an active display type, which has high luminous efficiency, and is generally used as a high-definition large-sized display device.

The OLED device generally includes a substrate, an anode disposed on the substrate, a hole injection layer disposed on the anode, a hole transport layer disposed on the hole injection layer, and a light-emitting layer disposed on the hole transport layer, an electron transport layer on the light-emitting layer, an electron injection layer provided on the electron transport layer, and a cathode provided on the electron injection layer. The illumination principle of the OLED device is that the semiconductor material and organic light-emitting material are driven by an electric field, causing illumination by carrier injection and recombination. Specifically, an OLED device generally uses an indium tin oxide (ITO) electrode and a metal electrode as the anode and the cathode of the device, respectively. Under a certain voltage, electrons and holes are injected respectively from the cathode and the anode to the electron transport layer and the hole transport layer, respectively. The electrons and holes migrate to the light-emitting layer through the electron transport layer and the hole transport layer, respectively, and meet in the light-emitting layer to form excitons and excite the light-emitting molecules, and the latter emits visible light through radiation relaxation.

In the prior art, the OLED device in multiple sub-pixels of an OLED display panel is generally fabricated by using a precision metal mask (FMM). With the development of the market, the resolution and brightness of the display device by the consumer are required to be higher and higher. For the high-resolution AMOLED display device, the precision metal mask for evaporation is one of the most critical technologies that restrict their development. This is due to the increased resolution of OLED display panel. The fabrication of precision metal mask for evaporation will become more and more difficult. At the same time, due to the increase of the resolution, the distance between the light-emitting regions in the sub-pixels is getting smaller and smaller, and the color mixing phenomenon of the display panel by evaporation will become more and more serious.

In particular, the conventional strip-shaped red (R), green (G), and blue (B) sub-pixels, the opening region of the precision metal mask corresponding to each sub-pixel is elongated and having a long length such that the linearity control is difficult so that color mixing is easy to occur. The sub-pixel arrangement by a dot-shaped (Slot) way does not cause the length of the opening region to be longer, and the linearity can be controlled, but in the process of manufacturing the opening region of the precision metal mask, a certain metal raw material is left as a connecting bridge between each dot-shaped opening region, thereby causing the size of the opening region of the precision metal mask to be reduced, which greatly affects the aperture ratio of the produced OLED display panel. The brightness and service life of OLED display panels cannot meet the requirements, reducing product yield and limiting the mass production of high-resolution OLED display panels.

The Sub Pixel Rendering (SPR) technology refers to the technique of sharing partial sub-pixels by adjacent pixels. This technique can improve the sensory resolution, so that the display can achieve higher sensory resolution with the same sub-pixel arrangement density, or in the case of maintaining the same sensory resolution, reducing the requirement for the arrangement density of the display sub-pixels.

SUMMARY OF THE INVENTION

An object of the present invention is to provide a pixel arrangement structure, which can be applied to an OLED display panel, can improve the resolution of the OLED display panel, reduce the fabrication difficulty of the OLED display panel, increase the pixel area, and improve the brightness and life of the OLED display panel.

In order to achieve the above purpose, the present invention provides a pixel arrangement structure, comprising: multiple first pixel rows and multiple second pixel rows arranged alternately; wherein each of the first pixel rows includes multiple first sub-pixels and multiple second sub-pixels disposed alternately and at intervals, and each of the second pixel rows includes multiple third sub-pixels disposed at intervals; and wherein the first sub-pixel and the second sub-pixel adjacent to the third sub-pixel form a virtual triangle, the third sub-pixel is disposed in the virtual triangle formed by the first sub-pixel and the second sub-pixel adjacent to the third sub-pixel, and the first sub-pixel and the second sub-pixel are disposed at vertexes of the virtual triangle.

Wherein areas of the first sub-pixel and the second sub-pixel are the same, and the area of each of the first sub-pixel and the second sub-pixel is greater than an area of the third sub-pixel.

Optionally, a shape of the third sub-pixel is a regular hexagon.

Optionally, the first sub-pixel includes three first regular hexagonal portions having a same area, a pair of adjacent side edges of each first regular hexagonal portion is respectively overlapped with side edges of the other two first regular hexagonal portions; the second sub-pixel includes three second regular hexagonal portions having a same area, a pair of adjacent side edges of each second regular hexagonal portion is respectively overlapped with side edges of the other two second regular hexagonal portions.

Wherein a contour edge of each of the first sub-pixel and the second sub-pixel has three concave angles; the three concave angles of the contour edge of the first sub-pixel are respectively opposite to vertexes of three third sub-pixels adjacent to the first sub-pixel; and the three concave angles of the contour edge of the second sub-pixel are respectively opposite to vertexes of three third sub-pixels adjacent to the second sub-pixel.

Optionally, a shape of the third sub-pixel is a circle.

Optionally, each of the first sub-pixel and the second sub-pixel includes three first sides and three second sides, and the first sides and the second sides are alternately connected to form a closed graphic; the first side is an arc that is caved toward an inside of the closed graphic, and the second side is an arc that protrudes outside the closed graphic.

Wherein one first sub-pixel and two second sub-pixels adjacent to the third sub-pixel form a virtual equilateral triangle, the one first sub-pixel and the two second sub-pixels adjacent to the third sub-pixel are respectively located at three vertexes of the virtual equilateral triangle, and a center of the third sub-pixel and a center of the virtual equilateral triangle are coincide.

Wherein two first sub-pixels and one second sub-pixel adjacent to the third sub-pixel form a virtual equilateral triangle, the two first sub-pixels and the one second sub-pixel adjacent to the third sub-pixel are respectively located at three vertexes of the virtual equilateral triangle, and a center of the third sub-pixel and a center of the virtual equilateral triangle are coincide.

Optionally, colors of the first sub-pixel, the second sub-pixel, and the third sub-pixel are different, and are respectively one of a red sub-pixel, a blue sub-pixel and a green sub-pixel Advantageous effects of the present invention, the pixel arrangement structure of the present invention includes multiple first pixel rows and multiple second pixel rows arranged alternately. Wherein each of the first pixel rows includes multiple first sub-pixels and multiple second sub-pixels disposed alternately and at intervals, and each of the second pixel rows includes multiple third sub-pixels disposed at intervals. Wherein the first sub-pixel and the second sub-pixel adjacent to the third sub-pixel form a virtual triangle, the third sub-pixel is disposed in the virtual triangle formed by the first sub-pixel and the second sub-pixel adjacent to the third sub-pixel. Applying the pixel arrangement structure to an OLED display panel can improve the resolution, reduce the fabrication difficulty, increase the pixel area, and improve the brightness and life of the OLED display panel.

BRIEF DESCRIPTION OF THE DRAWINGS

In order to further understand the features and technical contents of the present invention, please refer to the following detailed description and drawings regarding the present invention. However, the drawings are provided for purposes of illustration and description only and are not intended to be limiting.

DETAILED DESCRIPTION OF PREFERRED EMBODIMENTS

To further explain the technical means and effects of the present invention, the following is a detailed description of the preferred embodiments of the invention and the accompanying drawings.

The invention provides a pixel arrangement structure, which is mainly applied to an OLED display panel to improve the resolution of the OLED display panel, reduce the difficulty in manufacturing the OLED display panel, increase the pixel area, and improve the brightness and life of the OLED display panel.

Figure 1:
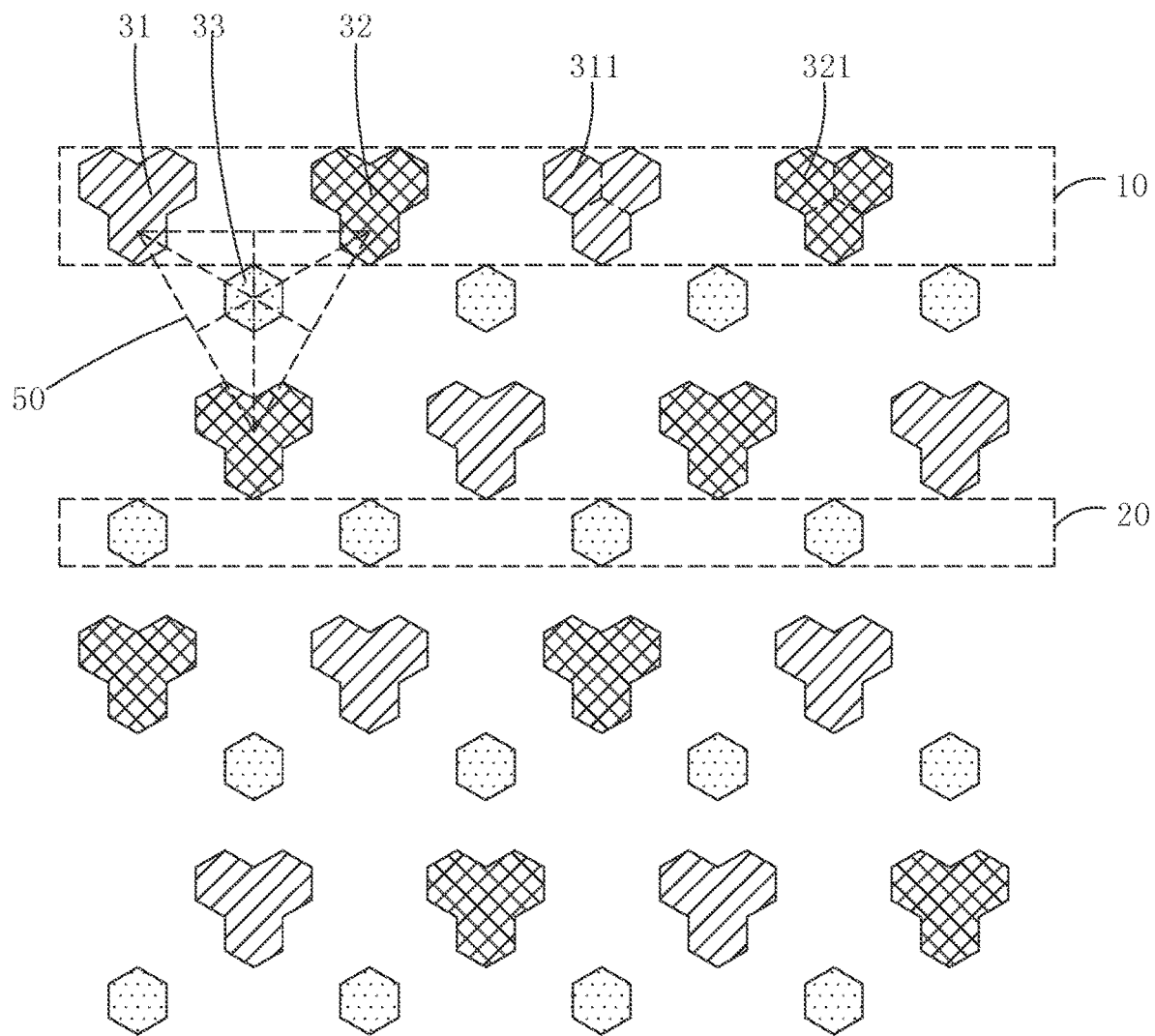
FIG. 1 is a schematic structural diagram of a pixel arrangement structure according to a first embodiment of the present invention.

Referring to FIG. 1, in a first embodiment of the pixel arrangement structure of the present invention, the pixel arrangement structure includes multiple first pixel rows 10 and multiple second pixel rows 20 arranged alternately. Each of the first pixel rows 10 includes multiple first sub-pixels 31 and multiple second sub-pixels 32 disposed alternately and at intervals, and each of the second pixel rows 20 includes multiple third sub-pixels 33 disposed at intervals. The first sub-pixel 31 and the second sub-pixel 32 adjacent to the third sub-pixel 33 form a virtual triangle 50, the third sub-pixel 33 is disposed in the virtual triangle 50 formed by the first sub-pixel 31 and the second sub-pixel 32 adjacent to the third sub-pixel 33, and the first sub-pixel 31 and the second sub-pixel 32 are disposed at vertexes of the virtual triangle 50.

Specifically, as shown in FIG. 1, in the first embodiment, areas of the first sub-pixel 31 and the second sub-pixel 32 are the same, and the area of each of the first sub-pixel 31 and the second sub-pixel 32 is greater than an area of the third sub-pixel 33.

Figure 2:
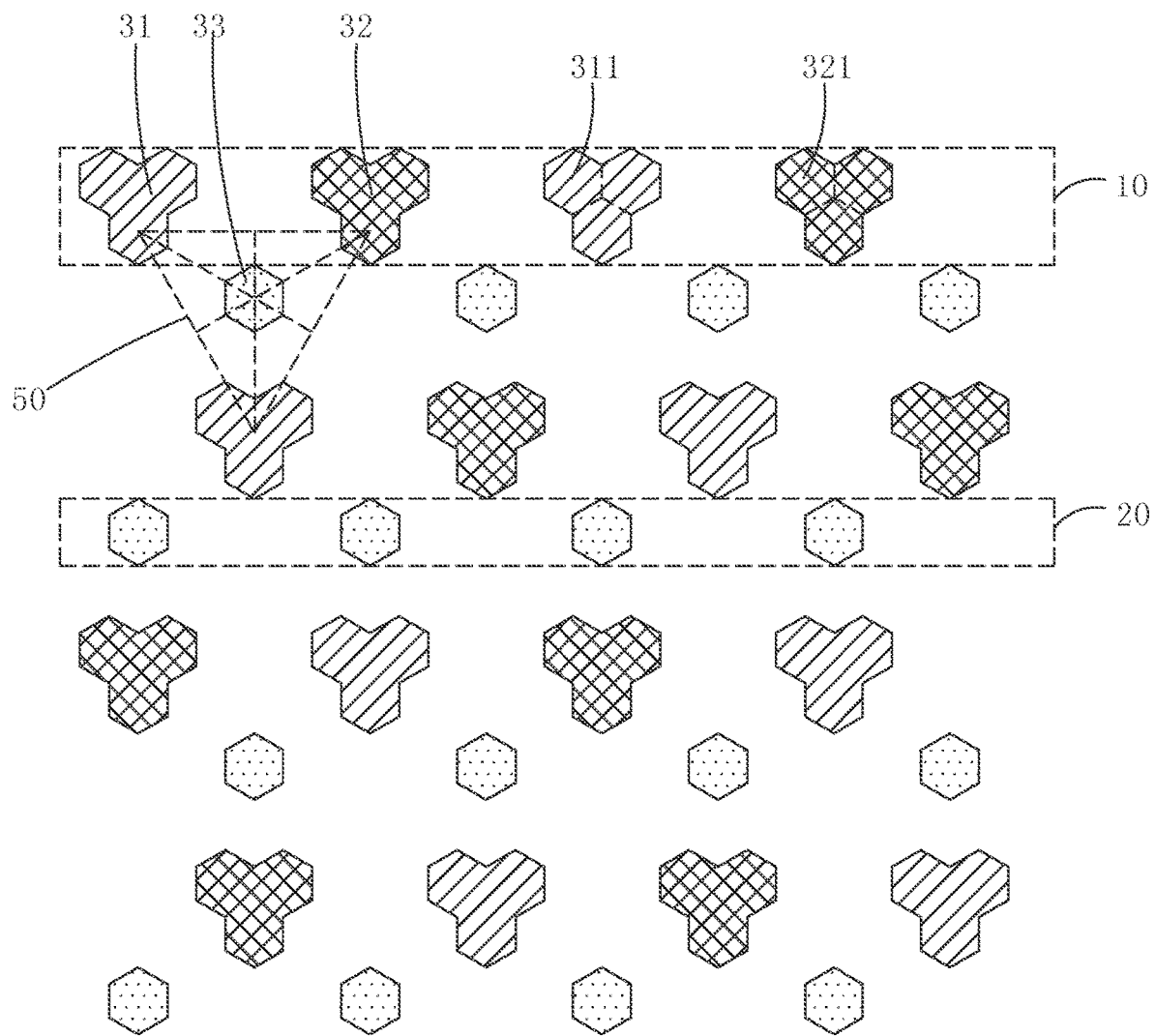
FIG. 2 is a schematic structural diagram of a pixel arrangement structure according to a second embodiment of the present invention.

Specifically, as shown in FIG. 1, in the first embodiment, one first sub-pixel 31 and two second sub-pixels 32 adjacent to the third sub-pixel 33 form a virtual equilateral triangle. The one first sub-pixel 31 and the two second sub-pixels 32 adjacent to the third sub-pixel 33 are respectively located at three vertexes of the virtual equilateral triangle 50, and a center of the third sub-pixel 33 and a center of the virtual equilateral triangle 50 are coincide. Alternatively, in other embodiments, as shown in FIG. 2, two first sub-pixels 31 and one second sub-pixel 32 adjacent to the third sub-pixel 33 form a virtual equilateral triangle. The two first sub-pixels 31 and the one second sub-pixel 32 adjacent to the third sub-pixel 33 are respectively located at three vertexes of the virtual equilateral triangle 50, and a center of the third sub-pixel 33 and a center of the virtual equilateral triangle 50 are coincide.

Further, as shown in FIG. 1, in the first embodiment, except for a first row of the first pixel rows 10, each row of the first pixel rows 10 is shifted to a left relative to a previous row of the first pixel rows 10 by 0.5 times of a distance between a center of the first sub-pixel 31 and a center of the second sub-pixel 32 which are adjacent.

Specifically, referring to FIG. 1, each of the third sub-pixels 33 is correspondingly disposed at a gap between the first sub-pixels 31 and the second sub-pixels 32 which are adjacent and arranged at intervals.

Specifically, referring to FIG. 1, in the first embodiment, a shape of the third sub-pixel 33 is a regular hexagon. The first sub-pixel 31 includes three first regular hexagonal portions 311 having a same area. A pair of adjacent side edges of each first regular hexagonal portion 311 is respectively overlapped with side edges of the other two first regular hexagonal portions 311. The second sub-pixel 32 includes three second regular hexagonal portions 321 having a same area. A pair of adjacent side edges of each second regular hexagonal portion 311 is respectively overlapped with side edges of the other two second regular hexagonal portions 321.

Since the first sub-pixel 31 includes three first regular hexagonal portions 311 having the same area, the second sub-pixel 32 includes three second regular hexagonal portions 321 having the same area, so that a contour edge of each of the first sub-pixel 31 and the second sub-pixel 32 has three concave angles. The three concave angles of the contour edge of the first sub-pixel 31 are respectively opposite to vertexes of three third sub-pixels 33 adjacent to the first sub-pixel 31.

The three concave angles of the contour edge of the second sub-pixel 32 are respectively opposite to vertexes of three third sub-pixels 33 adjacent to the second sub-pixel 32. It can be understood that the structure that the first sub-pixel 31 includes three first regular hexagonal portions 311 having the same area and the second sub-pixels 32 includes three second regular hexagonal portions 321 having the same area is an ideal structure. In the manufacturing process, due to limitations of the process equipment and conditions, the structures of the first sub-pixel 31 and the second sub-pixel 32 may deviate from the ideal state. For example, the vertexes of the first regular hexagon portion 311 and the second regular hexagon portion 321 are arc-shaped.

Preferably, colors of the first sub-pixel 31, the second sub-pixel 32, and the third sub-pixel 33 are different, and are respectively one of a red sub-pixel, a blue sub-pixel, and a green sub-pixel. In the first embodiment, the first sub-pixel 31, the second sub-pixel 32, and the third sub-pixel 33 respectively emit a red light, a blue light, and a green light. Corresponding to the OLED display panel, that is, the first sub-pixel 31, the second sub-pixel 32 and the third sub-pixel 33 respectively include organic light-emitting diodes that emit a red light, a blue light, and a green light. Of course, in other embodiments of the present invention, the first sub-pixel 31, the second sub-pixel 32 and the third sub-pixel 33 may also emit light of other colors.

It should be noted that, in the first embodiment of the pixel arrangement structure of the present invention, the virtual triangle 50 is formed by the first sub-pixel 31 and the second sub-pixel 32 adjacent to each third sub-pixels 33, and the third sub-pixel 33 is disposed in the corresponding virtual triangle 50, so that the sub-pixels between the pixels can be shared, and the sub-pixels can be effectively reduced comparing to the conventional strip-shaped and sequentially arranged red, green and blue sub-pixel structures so that the display can achieve higher sensory resolution with the same sub-pixel arrangement density, reduce the arrangement density of the display sub-pixels while maintaining the same sensory resolution, and reduce the manufacturing difficulty of the OLED display panel.

In the meantime, in the first embodiment of the present invention, each of the first sub-pixel 31 and the second sub-pixel 32 is provided with a structure having three regular hexagonal portions with the same area and combined together, each has three portions extending outward from the center such that the areas of the first sub-pixel 31 and the second sub-pixel 32 are increased under the premise of ensuring the gap between the sub-pixels, thereby enabling the pixel arrangement structure to be applied to the OLED display panel. The brightness of the OLED display panel is increased and the service life is increased.

With reference to FIG. 2, and FIG. 2 is a second embodiment of a pixel arrangement structure according to the present invention. The second embodiment is different from the first embodiment in that the pixel arrangement structure of the second embodiment forms a left-right mirror relation with respective to the first embodiment. That is, in the second embodiment, except for the first row of the first pixel rows 10, each row of the first pixel rows 10 is shifted to a right by 0.5 times of a distance between a center of the first sub-pixel 31 and a center of the second sub-pixel 32 which are adjacent. The rest are the same as the first embodiment, and the description will not be repeated here.

Figure 3:
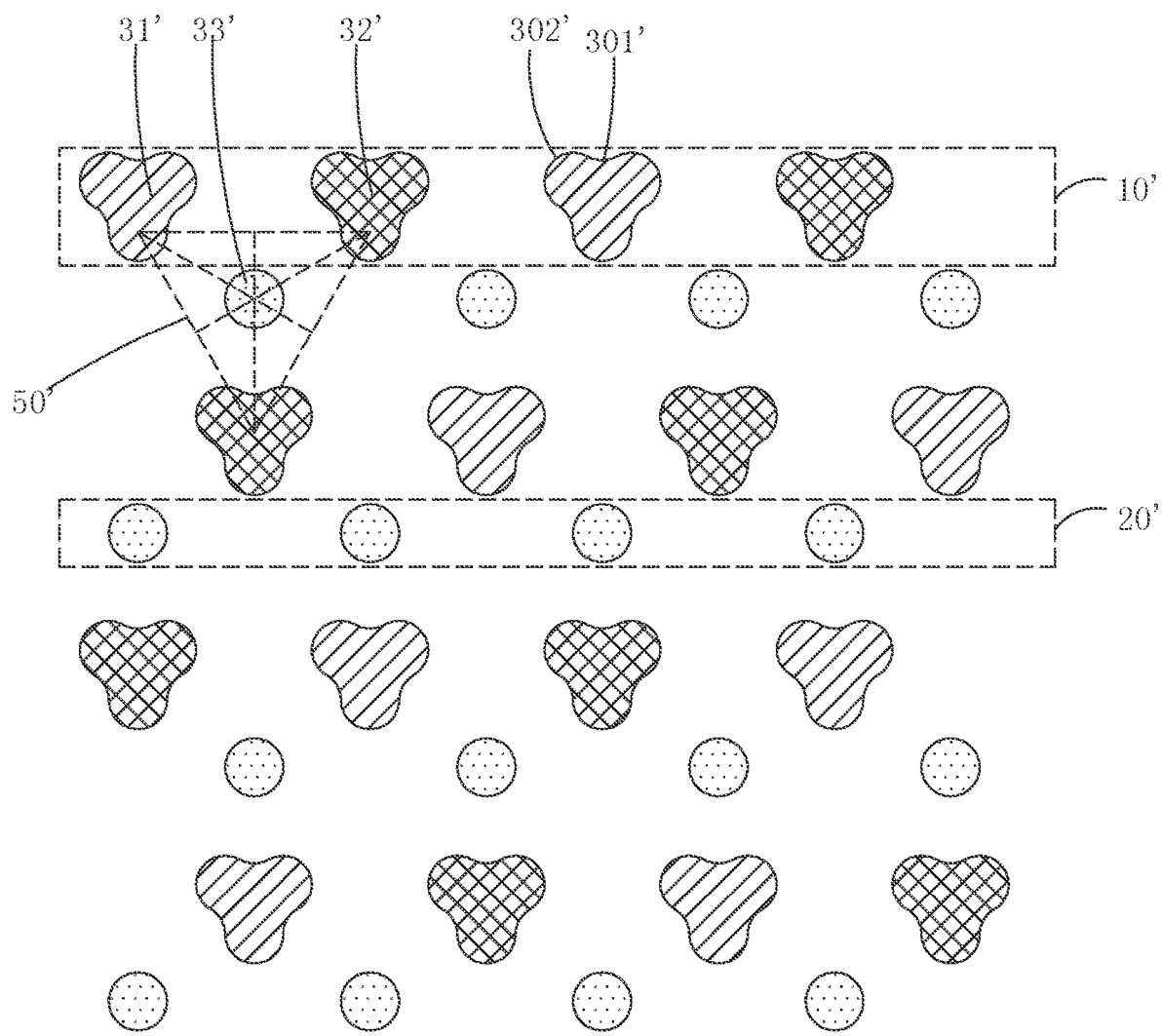
FIG. 3 is a schematic structural diagram of a pixel arrangement structure according to a third embodiment of the present invention.

Referring to FIG. 3, in a third embodiment of the pixel arrangement structure of the present invention, the pixel arrangement structure includes a multiple first pixel rows 10' and multiple second pixel rows 20' arranged alternately. Each first pixel row 10' includes multiple first sub-pixels 31' and multiple second sub-pixels 32' disposed alternately and at intervals, and each second pixel row 20' includes multiple third sub-pixels 33' disposed at intervals. The first sub-pixel 31' and the second sub-pixel 32' adjacent to the third sub-pixel 33' form a virtual triangle 50', the third sub-pixel 33' is disposed in the virtual triangle 50' formed by the first sub-pixel 31' and the second sub-pixel 32' adjacent to the third sub-pixel 33', and the first sub-pixel 31' and the second sub-pixel 32' are disposed at vertexes of the virtual triangle 50'.

Specifically, as shown in FIG. 3, in the third embodiment, areas of the first sub-pixel 31' and the second sub-pixel 32' are the same, and an area of each of the first sub-pixel 31' and the second sub-pixel 32' is greater than an area of the third sub-pixel 33'.

Specifically, as shown in FIG. 3, in the third embodiment, one first sub-pixel 31' and two second sub-pixels 32' adjacent to the third sub-pixel 33' form a virtual equilateral triangle. The one first sub-pixel 31' and the two second sub-pixels 32' adjacent to the third sub-pixel 33' are respectively located at three vertexes of the virtual triangle 50', and the center of the third sub-pixel 33' and the center of the virtual triangle 50' are coincide. Alternatively, in other embodiments, two first sub-pixels 31' and one second sub-pixel 32' adjacent to the third sub-pixel 33' form a virtual equilateral triangle. The two first sub-pixels 31' and the one second sub-pixel 32' adjacent to the third sub-pixel 33' are respectively located at three vertexes of the virtual triangle 50', and the center of the third sub-pixel 33' and the center of the virtual triangle 50' are coincide.

Further, as shown in FIG. 3, in the third embodiment, except for a first row of the first pixel rows 10', each row of the first pixel rows 10' is shifted to a left relative to a previous row of the first pixel rows 10' by 0.5 times of a distance between a center of the first sub-pixel 31' and a center of the second sub-pixel 32' which are adjacent.

Specifically, referring to FIG. 3, in the third embodiment, a shape of the third sub-pixel 33' is a circle. Each of the first sub-pixel 31' and the second sub-pixel 32' includes three first sides 301' and three second sides 302'. The first sides 301' and the second sides 302' are alternately connected to form a closed graphic. The first side 301' is an arc that is caved toward an inside of the closed graphic, and the second side 302' is an arc that protrudes outside the closed graphic.

It is worth mentioning that, in the ideal state of the third embodiment of the pixel arrangement structure, the shapes of the first sub-pixel 31' and the second sub-pixel 32' should be identical. And the radius of curvature of the three first sides 301' of each of the first sub-pixel 31' and the second sub-pixel 32' is also the same, and the radius of curvature 302' of the three second sides is the same. However, in the third embodiment of the pixel arrangement structure, in the actual fabrication process, the shape of the first sub-pixel 31' and the second sub-pixel 32' actually produced may be slightly different due to the existence of manufacturing errors (e.g., manufacturing errors caused by different states of the vapor deposition machine). The radius of curvature of the three first sides 301' of each of the first sub-pixels 31' and the three first sides 301' of the second sub-pixels 32' may also be slightly deviated. The radius of curvature of the three second sides 302' of each of the first sub-pixels 31' and the three second sides 302' of the second sub-pixels 32' may also be slightly deviated, which does not affect the implementation of the present invention.

Preferably, the colors of the first sub-pixel 31', the second sub-pixel 32', and the third sub-pixel 33' are different, and are respectively one of a red sub-pixel, a blue sub-pixel, and a green sub-pixel. In the first embodiment, the first sub-pixel 31', the second sub-pixel 32', and the third sub-pixel 33' respectively emit a red light, a blue light, and a green light. Corresponding to the OLED display panel, that is, the first sub-pixel 31', the second sub-pixel 32' and the third sub-pixel 33' respectively include organic light-emitting diodes that emit a red light, a blue light, and a green light. Of course, in other embodiments of the present invention, the first sub-pixel 31', the second sub-pixel 32', and the third sub-pixel 33' may also emit light of other colors.

It should be noted that, in the first embodiment of the pixel arrangement structure of the present invention, the virtual triangle 50' is formed by the first sub-pixel 31' and the second sub-pixel 32' adjacent to each third sub-pixels 33', and the third sub-pixel 33' is disposed in the corresponding virtual triangle 50', so that the sub-pixels between the pixels can be shared, and the sub-pixels can be effectively reduced comparing to the conventional strip-shaped and sequentially arranged red, green and blue sub-pixel structures so that the display can achieve higher sensory resolution with the same sub-pixel arrangement density, reduce the arrangement density of the display sub-pixels while maintaining the same sensory resolution, and reduce the manufacturing difficulty of the OLED display panel.

At the same time, when the FMM is fabricated in actual production, it is difficult to form a square or pointed pattern regardless of etching or laser. In the third embodiment of the present invention, by providing the first sub-pixel 31' and the second sub-pixel 32', each of the three first sides 301' and the three second sides 302' are enclosed by a closed graphic, and setting the third sub-pixel 33' to a circle, the present invention is more consistent with the principle of diffusion, which can effectively reduce the difficulty of making FMM. And the circular third sub-pixel 33' is the smallest and most efficient shape in the same area, and the micro-non-circular illuminator is also regarded as an approximately circular shape due to the halo effect of the human eye. Therefore, setting the third sub-pixel 33' to a circular shape can maximize the efficiency of the third sub-pixel 33' and conform to the blooming effect of the human eye.

Figure 4:
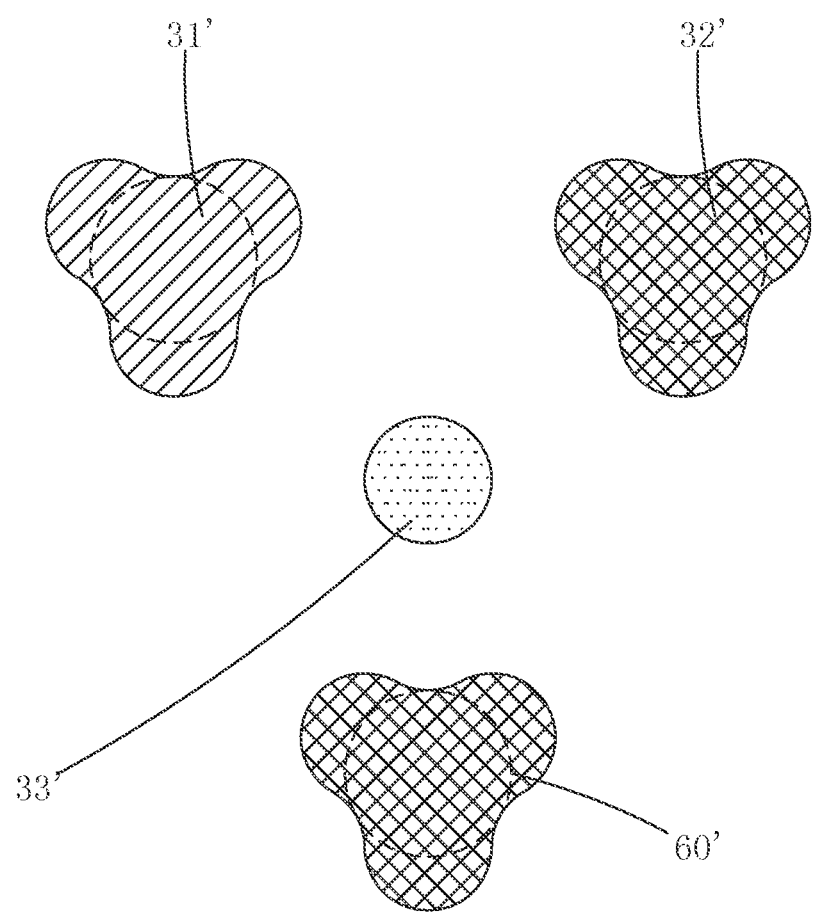
FIG. 4 is a schematic diagram of a pixel arrangement structure of the third embodiment for enhancing a sub-pixel area.

In addition, referring to FIG. 4, since each of the first sub-pixel 31' and the second sub-pixel 32' has three portions extending outward from the center, and the three first sub-pixels 33' of the first sub-pixel 31' are respectively opposite to the three third sub-pixels 33' adjacent to the first sub-pixel 31', and the three first sub-pixels 301' of each of the second sub-pixels 32' are respectively opposite to the three third sub-pixels 33' adjacent to the second sub-pixel 32'. Comparing to a normal design, the first sub-pixel and the second sub-pixel 60' are also circular such that in the third embodiment of the present invention, the areas of the first sub-pixel 31' and the second sub-pixel 32' are both greater than the area of the normal circular first sub-pixel and the second sub-pixel 60' when the gap between the sub-pixels is ensured. Accordingly, after the pixel arrangement structure is applied to the OLED display panel, the brightness of the OLED display panel is increased, and the service life increased.

In summary, the pixel arrangement structure of the present invention includes multiple first pixel rows and multiple second pixel rows arranged alternately. Wherein each of the first pixel rows includes multiple first sub-pixels and multiple second sub-pixels disposed alternately and at intervals, and each of the second pixel rows includes multiple third sub-pixels disposed at intervals. Wherein the first sub-pixel and the second sub-pixel adjacent to the third sub-pixel form a virtual triangle, the third sub-pixel is disposed in the virtual triangle formed by the first sub-pixel and the second sub-pixel adjacent to the third sub-pixel. Applying the pixel arrangement structure to an OLED display panel can improve the resolution, reduce the fabrication difficulty, increase the pixel area, and improve the brightness and life of the OLED display panel.

As described above, for those of ordinary skill in the art, various other corresponding changes and modifications can be made according to the technical solutions and technical ideas of the present invention. All such changes and modifications are intended to fall within the scope of the appended claims.

What is claimed is:

1. A pixel arrangement structure, comprising:
    multiple first pixel rows and multiple second pixel rows arranged alternately;
    wherein each of the first pixel rows includes multiple first sub-pixels and multiple second sub-pixels disposed alternately and at intervals, and each of the second pixel rows includes multiple third sub-pixels disposed at intervals; and
    wherein the first sub-pixel and the second sub-pixel adjacent to the third sub-pixel form a virtual triangle, the third sub-pixel is disposed in the virtual triangle formed by the first sub-pixel and the second sub-pixel adjacent to the third sub-pixel, and the first sub-pixel and the second sub-pixel are disposed at vertexes of the virtual triangle;
    wherein a shape of the third sub-pixel is a regular hexagon;
    wherein the first sub-pixel includes three first regular hexagonal portions having a same area, a pair of adjacent side edges of each first regular hexagonal portion is respectively overlapped with side edges of the other two first regular hexagonal portions;
    the second sub-pixel includes three second regular hexagonal portions having a same area, a pair of adjacent side edges of each second regular hexagonal portion is respectively overlapped with side edges of the other two second regular hexagonal portions;
    wherein a contour edge of each of the first sub-pixel and the second sub-pixel has three concave angles;
    the three concave angles of the contour edge of the first sub-pixel are respectively opposite to vertexes of three third sub-pixels adjacent to the first sub-pixel; and
    the three concave angles of the contour edge of the second sub-pixel are respectively opposite to vertexes of three third sub-pixels adjacent to the second sub-pixel.

2. The pixel arrangement structure according to claim 1, wherein areas of the first sub-pixel and the second sub-pixel are the same, and the area of each of the first sub-pixel and the second sub-pixel is greater than an area of the third sub-pixel.

3. The pixel arrangement structure according to claim 1, wherein each of the first sub-pixel and the second sub-pixel includes three first sides and three second sides, and the first sides and the second sides are alternately connected to form a closed graphic; the first side is an arc that is caved toward an inside of the closed graphic, and the second side is an arc that is caved toward an outside the closed graphic.

4. The pixel arrangement structure according to claim 1, wherein one first sub-pixel and two second sub-pixels adjacent to the third sub-pixel form a virtual equilateral triangle, the one first sub-pixel and the two second sub-pixels adjacent to the third sub-pixel are respectively located at three vertexes of the virtual equilateral triangle, and a center of the third sub-pixel and a center of the virtual equilateral triangle are coincide.

5. The pixel arrangement structure according to claim 1, wherein two first sub-pixels and one second sub-pixel adjacent to the third sub-pixel form a virtual equilateral triangle, the two first sub-pixels and the one second sub-pixel adjacent to the third sub-pixel are respectively located at three vertexes of the virtual equilateral triangle, and a center of the third sub-pixel and a center of the virtual equilateral triangle are coincide.

6. The pixel arrangement structure according to claim 1, wherein each of the third sub-pixels is correspondingly disposed at a gap between the first sub-pixels and the second sub-pixels which are adjacent and arranged at intervals.

7. The pixel arrangement structure according to claim 1, wherein colors of the first sub-pixel, the second sub-pixel, and the third sub-pixel are different, and are respectively one of a red sub-pixel, a blue sub-pixel and a green sub-pixel.

\* \* \* \* \*